(12) United States Patent
Kim et al.

(10) Patent No.: US 11,659,737 B2
(45) Date of Patent: May 23, 2023

(54) ORGANIC LIGHT-EMITTING DISPLAY DEVICE AND METHOD OF MANUFACTURING THE SAME

(71) Applicant: Samsung Display Co., Ltd., Yongin-si (KR)

(72) Inventors: Changmok Kim, Yongin-si (KR); Jinho Kwack, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 26 days.

(21) Appl. No.: 17/157,312

(22) Filed: Jan. 25, 2021

(65) Prior Publication Data

US 2021/0143238 A1    May 13, 2021

Related U.S. Application Data

(63) Continuation of application No. 16/859,643, filed on Apr. 27, 2020, now Pat. No. 10,903,292, which is a (Continued)

(30) Foreign Application Priority Data

May 26, 2016   (KR) .................. 10-2016-0064954

(51) Int. Cl.
  *H01L 27/32*       (2006.01)
  *H01L 51/52*       (2006.01)
  (Continued)

(52) U.S. Cl.
  CPC ....... *H01L 27/3248* (2013.01); *G09G 3/2983* (2013.01); *G09G 3/3208* (2013.01);
  (Continued)

(58) Field of Classification Search
  CPC .................................................. H01L 51/5246
  See application file for complete search history.

(56) References Cited

U.S. PATENT DOCUMENTS

| 7,211,826 B2 | 5/2007 | Park et al. |
| 2011/0013125 A1 | 1/2011 | Lee et al. |

(Continued)

FOREIGN PATENT DOCUMENTS

| KR | 10-2005-0023014 | 3/2005 |
| KR | 2009-210414 | 9/2009 |

(Continued)

OTHER PUBLICATIONS

Non-Final Office Action dated Mar. 26, 2018 issued in U.S. Appl. No. 15/600,986.

(Continued)

*Primary Examiner* — Mounir S Amer
(74) *Attorney, Agent, or Firm* — H.C. Park & Associates, PLC

(57) ABSTRACT

An organic light-emitting display apparatus including: a substrate including a display area and a peripheral area at an outer side of the display area; a pixel electrode disposed in the display area of the substrate; a pixel-defining layer disposed on the pixel electrode and exposing at least a portion of the pixel electrode; an intermediate layer disposed on the pixel electrode; an opposite electrode disposed on the intermediate layer; a first conductive layer disposed in the peripheral area of the substrate and including at least one opening; a first block structure and a second block structure disposed on the first conductive layer and separated from each other with the at least one opening therebetween; and an encapsulation structure disposed on the opposite electrode in the display area and the peripheral area.

16 Claims, 11 Drawing Sheets

Related U.S. Application Data continuation of application No. 16/239,536, filed on Jan. 4, 2019, now Pat. No. 10,636,854, which is a continuation of application No. 15/600,986, filed on May 22, 2017, now Pat. No. 10,319,797.

(51) Int. Cl.
*G09G 3/298* (2013.01)
*G09G 3/3208* (2016.01)
*H01L 51/00* (2006.01)

(52) U.S. Cl.
CPC ...... *H01L 27/3209* (2013.01); *H01L 27/3244* (2013.01); *H01L 27/3262* (2013.01); *H01L 51/0097* (2013.01); *H01L 51/5246* (2013.01); *H01L 51/5271* (2013.01); *G09G 2300/023* (2013.01); *G09G 2300/0426* (2013.01); *G09G 2300/0439* (2013.01); *H01L 2227/323* (2013.01)

(56) References Cited

U.S. PATENT DOCUMENTS

| | | | |
|---|---|---|---|
| 2013/0126882 A1 | 5/2013 | You et al. |
| 2013/0168644 A1 | 7/2013 | Park |
| 2015/0091030 A1 | 4/2015 | Lee et al. |
| 2015/0228927 A1 | 8/2015 | Kim |
| 2016/0285045 A1 | 9/2016 | Park et al. |
| 2016/0343739 A1 | 11/2016 | Liu |

FOREIGN PATENT DOCUMENTS

| | | |
|---|---|---|
| KR | 10-2011-0007821 | 1/2011 |
| KR | 10-2015-0025994 | 3/2015 |
| KR | 10-2015-0037134 | 4/2015 |
| KR | 10-2015-0094950 | 8/2015 |
| WO | 2009/110518 | 9/2009 |

OTHER PUBLICATIONS

Final Office Action dated Oct. 31, 2018 issued in U.S. Appl. No. 15/600,986.

Non-Final Office Action dated Mar. 20, 2019, issued in U.S. Appl. No. 16/239,536.

Final Office Action dated Oct. 3, 2019, issued in U.S. Appl. No. 16/239,536.

Notice of Allowance dated Dec. 23, 2019, issued in U.S. Appl. No. 16/239,536.

Non-Final Office Action dated May 28, 2020, issued in U.S. Appl. No. 16/859,643.

Notice of Allowance dated Sep. 15, 2020, issued in U.S. Appl. No. 16/859,643.

ORGANIC LIGHT-EMITTING DISPLAY DEVICE AND METHOD OF MANUFACTURING THE SAME

CROSS-REFERENCE TO RELATED APPLICATIONS

This application is a Continuation of U.S. patent application Ser. No. 16/859,643, filed Apr. 27, 2020, which is a Continuation of U.S. application Ser. No. 16/239,536, filed Jan. 4, 2019, now issued as U.S. Pat. No. 10,636,859, which is a Continuation of U.S. application Ser. No. 15/600,986, filed on May 22, 2017, now issued as U.S. Pat. No. 10,319,797, which claims priority to and the benefit of Korean Patent Application No. 10-2016-0064954, filed on May 26, 2016, all of which are hereby incorporated by reference for all purposes as if fully set forth herein.

BACKGROUND

Field

Exemplary embodiments relate to an organic light-emitting display apparatus and a method of manufacturing the same.

Discussion of the Background

Organic light-emitting display apparatuses are self-emitting type display apparatuses that include an organic light-emitting device (OLED) including a hole injection electrode, an electron injection electrode, and an organic emission layer between the hole injection electrode and electron injection electrode, wherein excitons, which are generated by holes injected from the hole injection electrode and electrons injected from the electron injection electrode being united in the organic emission layer, emit light by falling from an excited state to a ground state.

Organic light-emitting display apparatuses that are self-emitting type display apparatuses require no additional light sources, and thus, they may be driven by a low voltage, and may be formed to be thin and lightweight. Also, organic light-emitting display apparatuses have excellent characteristics, such as wide viewing angles, high contrast, and rapid response rates. Thus, the scope of use thereof has been expanded to encompass personal mobile devices, such as MP3 players and cellular phones, as well as televisions.

However, the lifespan of the OLED may be decreased by oxidation of light-emitting materials caused by oxygen or water, and thus, an encapsulation unit for preventing oxygen or water from flowing into the OLED is needed. Recently, research and development has been actively conducted on a multi-layer thin film encapsulation technology or an adhesive film for encapsulation, which may be applied to a large organic light-emitting display apparatus and a flexible display apparatus.

Here, an organic layer included in the multi-layer thin film may easily leak out to a peripheral area of a display apparatus. In this case, external oxygen, water, etc. may penetrate through the organic layer to thereby deteriorate the OLED and reduce the lifespan and the reliability of the display apparatus.

To prevent this problem, a method of detecting whether an organic layer has leaked out has been developed in which a plurality of block structures are formed in the peripheral area of the display apparatus. To detect whether the organic layer has leaked out, a differential interference contrast (DIC) microscope may be used. The DIC microscope may precisely show a surface or an interface of an object to be inspected, and thus, may be useful for inspecting an object which is not easily detected via a general optical system. However, when the DIC microscope is used to identify whether the organic layer is disposed in an area between the plurality of block structures, it is hard to distinguish a concave-convex shape included in surfaces of layers disposed below the area between the plurality of block structures from the organic layer, because the surfaces are not flat.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting display apparatus and a method of manufacturing the same, whereby a defect rate may be reduced by precisely detecting whether an organic layer is disposed in an area between block structures.

Additional aspects will be set forth in part in the description which follows and, in part, will be apparent from the disclosure, or may be learned by practice of the inventive concept.

According to one or more exemplary embodiments, an organic light-emitting display apparatus includes: a substrate including a display area and a peripheral area at an outer side of the display area; a pixel electrode disposed in the display area of the substrate; a pixel-defining layer disposed on the pixel electrode and exposing at least a portion of the pixel electrode; an intermediate layer disposed on the pixel electrode; an opposite electrode disposed on the intermediate layer; a first conductive layer disposed in the peripheral area of the substrate and including at least one opening; a first block structure and a second block structure disposed on the first conductive layer and separated from each other with the at least one opening therebetween; and an encapsulation structure disposed on the opposite electrode in the display area and the peripheral area.

The organic light-emitting display apparatus may further include a second conductive layer disposed between the substrate and the first conductive layer so as to be insulated from the first conductive layer.

The at least one opening included in the first conductive layer may overlap at least a portion of the second conductive layer in a plan view.

The organic light-emitting display apparatus may further include a thin film transistor disposed in the display area of the substrate and electrically connected with the pixel electrode; and a via-insulating layer covering the thin film transistor, wherein the thin film transistor includes an active layer, a gate electrode insulated from the active layer and disposed on a same layer as the second conductive layer, and a source electrode and a drain electrode disposed on a same layer as the first conductive layer.

Surface roughness of the first conductive layer may be greater than surface roughness of the second conductive layer.

The first conductive layer may include titanium (Ti) and the second conductive layer may include molybdenum (Mo).

The first block structure may include first layers disposed on a same layer as the pixel-defining layer and including a same material as the pixel-defining layer, and the second block structure may include a first layer disposed on a same layer as the via-insulating layer and including a same material as the via-insulating layer, and second layers disposed on the same layer as the pixel-defining layer and including the same material as the pixel-defining layer.

The organic light-emitting display apparatus may further include a connection wire disposed in the peripheral area of the substrate and connecting the opposite electrode with the first conductive layer, wherein the connection wire is disposed on a same layer as the pixel electrode.

The connection wire may extend from an area contacting the opposite electrode to an area between the first conductive layer and the first block structure, the connection wire covering the at least one opening included in the first conductive layer.

A width of the at least one opening included in the first conductive layer may be equal to or greater than about 2 µm.

The second block structure may be disposed at an outer side of the first block structure so as to surround at least a portion of the first block structure, and a height of the second block structure may be greater than a height of the first block structure.

The encapsulation structure may include a first inorganic layer, an organic layer, and a second inorganic layer that are sequentially disposed over the opposite electrode, wherein the first inorganic layer and the second inorganic layer cover the first block structure and the second block structure and contact each other over the first block structure and the second block structure.

According to one or more exemplary embodiments, a method of manufacturing an organic light-emitting display apparatus includes: forming a first conductive layer including at least one opening in a peripheral area of a substrate; forming a pixel electrode in a display area of the substrate; forming a pixel-defining layer exposing at least a portion of the pixel electrode; forming a first block structure and a second block structure on the first conductive layer so as to be separated from each other with the at least one opening therebetween, and so that the first block structure and the second block structure do not overlap the at least one opening; forming an intermediate layer on the pixel electrode; forming an opposite electrode on the intermediate layer; and forming an encapsulation structure on the opposite electrode.

The method may further include, before forming the first conductive layer, forming a second conductive layer in the peripheral area of the substrate.

The method may further include, before forming the pixel electrode, forming in the display area of the substrate a thin film transistor including an active layer, a gate electrode insulated from the active layer, and a source electrode and a drain electrode electrically connected to the active layer; and forming a via-insulating layer over the substrate to cover the thin film transistor, wherein the forming of the second conductive layer is simultaneously performed with the forming of the gate electrode of the thin film transistor, and the forming of the first conductive layer is simultaneously performed with the forming of the source electrode and the drain electrode of the thin film transistor.

The second block structure may include a first layer and second layers disposed on the first layer, the first block structure may include first layers disposed on a same layer as the second layers of the second block structure, the first layer of the second block structure may be formed simultaneously with the forming of the via-insulating layer, and the first layers of the first block structure and the second layers of the second block structure may be formed simultaneously with the forming of the pixel-defining layer.

The method may further include forming in the peripheral area of the substrate a connection wire connecting the opposite electrode with the first conductive layer, wherein the forming of the connection wire is performed simultaneously with the forming of the pixel electrode.

The connection wire may extend from an area contacting the opposite electrode to an area between the first conductive layer and the first block structure and covers the at least one opening included in the first conductive layer.

The second block structure may be formed at an outer side of the first block structure so as to surround at least a portion of the first block structure, and a height of the second block structure may be greater than a height of the first block structure.

The forming of the encapsulation structure may include: forming a first inorganic layer to cover the opposite electrode, the first block structure, and the second block structure; forming an organic layer on the first inorganic layer disposed at an inner side of the first block structure; and forming a second inorganic layer on the organic layer and a portion of the first inorganic layer covering the first block structure and the second block structure, wherein the first inorganic layer and the second inorganic layer contact each other on the first block structure and the second block structure.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
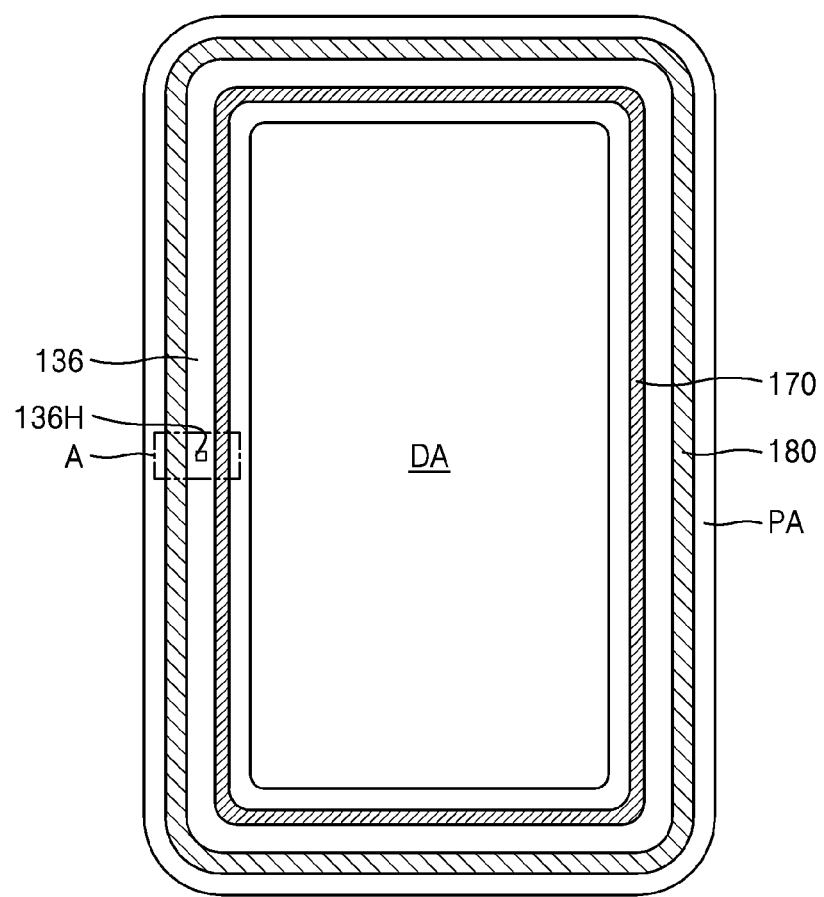
FIG. 1 is a schematic plan view of an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
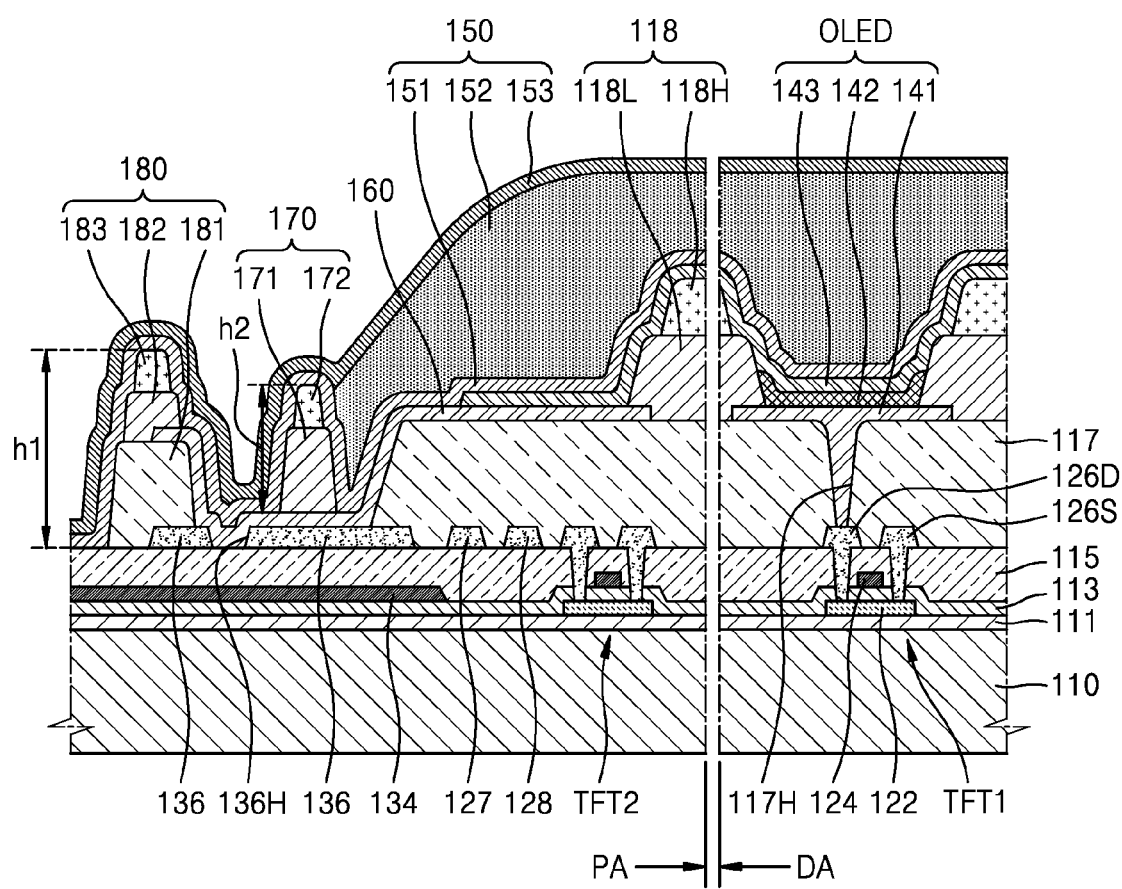
FIG. 2 is a schematic cross-sectional view of a portion of the organic light-emitting display apparatus of FIG. 1.

FIG. 1 is a schematic plan view of an organic light-emitting display apparatus according to an exemplary embodiment. FIG. 2 is a schematic cross-sectional view of a portion of the organic light-emitting display apparatus of FIG. 1.

Referring to FIGS. 1 and 2, the organic light-emitting display apparatus according to an exemplary embodiment may include a substrate 110 including a display area DA and a peripheral area PA at an outer side of the display area DA. A pixel electrode 141 may be disposed in the display area DA of the substrate 110. A pixel-defining layer 118 may be disposed on the pixel electrode 141 and include an opening exposing at least a portion of the pixel electrode 141. An intermediate layer 142 may be disposed on the pixel electrode 141, and an opposite electrode 143 may be disposed on the intermediate layer 142. A first conductive layer 136 may be disposed in the peripheral area PA of the substrate 110 and include at least one opening 136H. A first block structure 170 and a second block structure 180 may be disposed on the first conductive layer 136 and separated from each other with the at least one opening 136H therebetween, and an encapsulation structure 150 may be disposed on the opposite electrode 143 in the display area DA and the peripheral area PA.

The substrate 110 may include the display area DA and the peripheral area PA at the outer side of the display area DA, and may include various materials, such as glass, metal, or plastics. Also, the substrate 110 may be flexible. For example, the substrate 110 may include a polymer resin, such as polyethersulfone (PES), polyacrylate (PAR), polyetherimide (PEI), polyethylene naphthalate (PEN), polyethyleneterephthalate (PET), polyphenylene sulfide (PPS), polyarylate, polyimide (PI), polycarbonate (PC), or cellulose acetate propionate (CAP), but is not limited thereto.

A buffer layer 111 including an inorganic material, such as silicon oxide, silicon nitride, and/or silicon oxynitride, may be disposed on the substrate 110. The buffer layer 111 may planarize an upper surface of the substrate 110 or prevent or minimize penetration of impurities from the substrate 110, etc. through an active layer 122 of a thin film transistor TFT1. The thin film transistor TFT1 may be disposed in the display area DA of the substrate 110 and electrically connected to the pixel electrode 141. The thin film transistor TFT1 may include the active layer 122 including a semiconductor material, such as amorphous silicon, polycrystalline silicon, an oxide semiconductor, or an organic semiconductor material. The thin film transistor TFT1 may also include a gate electrode 124 insulated from the active layer 122, and a source electrode 126S and a drain electrode 126D, with the source electrode 126S and the drain electrode 126D each electrically connected to the active layer 122. The gate electrode 124 is disposed on the active layer 122, and according to a signal applied to the gate electrode 124, the source electrode 126S and the drain electrode 126D may be electrically connected to each other. The gate electrode 124 may be formed as a single layer or multiple layers including at least one of, for example, Al, Pt, Pd, Ag, Mg, Au, Ni, Nd, Ir, Cr, Li, Ca, Mo, Ti, W, and Cu, by taking into account adhesion to a layer adjacent to the gate electrode 124, surface flatness of a layer on which the gate electrode 124 is stacked, machinability, etc. According to an exemplary embodiment, the gate electrode 124 may be formed as a single layer including Mo, Mo having great surface flatness.

A first insulating layer 113 including an inorganic material, such as silicon oxide, silicon nitride, and/or silicon oxynitride, may be disposed between the active layer 122 and the gate electrode 124 so as to provide insulation between the active layer 122 and the gate electrode 124. Also, a second insulating layer 115 including an inorganic material, such as silicon oxide, silicon nitride, and/or silicon oxynitride, may be disposed on the gate electrode 124, and the source electrode 126S and the drain electrode 126D may be disposed in the second insulating layer 115. Each of the source electrode 126S and the drain electrode 126D may be electrically connected to the active layer 122 via a contact hole formed in the second insulating layer 115 and the first insulating layer 113. The source electrode 126S and the drain electrode 126D may be disposed on a same layer as the first conductive layer 136.

The source electrode 126S and the drain electrode 126D may be formed as a single layer or multiple layers including at least one material selected from, for example, Al, Pt, Pd, Ag, Mg, Au, Ni, Nd, Ir, Cr, Li, Ca, Mo, Ti, W, and Cu, by taking into account conductivity, etc. According to an exemplary embodiment, the source electrode 126S and the drain electrode 126D may include Ti, and may be triple layers including Ti/Al/Ti. Here, Ti disposed as an uppermost layer doesn't have a high level of surface flatness. Accordingly, an upper surface of the source electrode 126S and the drain electrode 126D may include minute concave-convex shapes.

A via-insulating layer 117 may be disposed on the thin film transistor TFT1 so as to cover the thin film transistor TFT1. The via-insulating layer 117 may have a flat upper surface so that the pixel electrode 141 may be formed to be flat. The via-insulating layer 117 may include an organic material, such as acryl, benzocyclobutene (BCB), PI, or hexamethyldisiloxane (HMDSO). In FIG. 2, the via-insulating layer 117 is illustrated as a single layer. However, the via-insulating layer 117 may be modified in various ways. For example, the via-insulating layer 117 may be multiple layers. The via-insulating layer 117 may extend from the display area DA to the peripheral area PA and cover a portion of the first conductive layer 136 disposed in the peripheral area PA. However, the via-insulating layer 117 does not cover the opening 136H of the first conductive layer 136.

The via-insulating layer 117 may include a via-hole 117H exposing any one of the source electrode 126S and the drain electrode 126D of the thin film transistor TFT1, and the pixel electrode 141 may contact any one of the source electrode 126S and the drain electrode 126D via the via-hole 117H and be electrically connected to the thin film transistor TFT1.

An organic light-emitting device OLED is disposed on the via-insulating layer 117, the organic light-emitting device OLED including the pixel electrode 141, the intermediate layer 142 disposed on the pixel electrode 141 and including an organic emission layer, and the opposite electrode 143.

The pixel electrode 141 may be formed as a transparent or semi-transparent electrode or a reflective electrode. When the pixel electrode 141 is formed as a transparent or semi-transparent electrode, the pixel electrode 141 may include a transparent conductive layer. The transparent conductive layer may be at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In this case, the pixel electrode 141 may further include a semi-transmissive layer to improve light efficiency, in addition to the transparent conductive layer. The semi-transmissive layer may be at least one selected from the group consisting of Ag, Mg, Al, Pt, Pd, Au, Ni, Nd, Ir, Cr, Li, Ca, and Yb formed as a thin film of several to tens of nm. When the pixel electrode 141 is formed as a reflective electrode, the pixel electrode 141 may include a reflective layer including Ag, Mg, Al, Pt, Pd, Au, Ni, Nd, Ir, Cr, or a compound thereof, and a transparent conductive layer disposed above and/or below the reflective layer. The transparent conductive layer may be at least one selected from the group consisting of ITO, IZO, ZnO, $In_2O_3$, IGO, and AZO. However, the present inventive concept is not limited thereto, and the pixel electrode 141 may be modified in various ways to include various materials and various structures. For example, the pixel electrode 141 may be formed as a single layer or multiple layers.

The pixel-defining layer 118 may be disposed on the via-insulating layer 117 to cover an edge region of the pixel electrode 141. The pixel-defining layer 118 may define a pixel and include an opening exposing at least a portion of the pixel electrode 141. The pixel-defining layer 118 may include an organic material, such as PI or HMDSO. The pixel-defining layer 118 may be formed as a single layer or multiple layers. In FIG. 2, the pixel-defining layer 118 is illustrated as a double layer 118L and 118H. However, the present inventive concept is not limited thereto. The pixel-defining layer 118 may be disposed in the display area DA and the peripheral area PA.

The intermediate layer 142 is disposed on a portion of the pixel electrode 141, is the pixel electrode 141 being exposed by the pixel-defining layer 118. The intermediate layer 142 may include the organic emission layer including a low molecular weight or a high molecular weight material. When the organic emission layer includes a low molecular weight material, the intermediate layer 142 may include a single layer or a stack including a hole injection layer (HIL), a hole transport layer (HTL), an organic emission layer, an electron transport layer (ETL), an electron injection layer (EIL), or the like. Here, the organic emission layer may include various organic materials, such as copper phthalocyanine (CuPc), N,N'-Di(naphthalene-1-yl)-N,N'-diphenyl-benzidine: NpB, tris-8-hydroxyquinoline aluminum (Alq3), etc. These layers included in the intermediate layer 142 may be formed by vapor deposition. When the organic emission layer includes a high molecular weight material, the intermediate layer may generally have a structure including the HTL and the EML. Here, the ETL may include PEDOT, and the organic emission layer may include a poly-phenylenevinylene-based organic material or a polyfluorene-based organic material.

However, the intermediate layer 142 is not limited thereto and may include various structures. Also, the intermediate layer 142 may include an integral layer in a plurality of pixel electrodes 141 or may include patterned layers, respectively corresponding to the plurality of pixel electrodes 141.

The opposite electrode 143 may be disposed on the intermediate layer 142 and the opposite electrode 143 may be disposed in the display area DA and the peripheral area PA. The opposite electrode 143 may be integrally formed in a plurality of pixels, unlike the pixel electrode 141.

The opposite electrode 143 may be formed as a transparent or semi-transparent electrode or a reflective electrode. When the opposite electrode 143 is formed as a transparent or semi-transparent, the opposite electrode 143 may include at least one material selected from Ag, Al, Mg, Li, Ca, Cu, LiF/Ca, LiF/Al, MgAg, and CaAg, and may be formed as a thin film having a thickness of several to tens of nm. When the opposite electrode 143 is formed as a reflective electrode, the opposite electrode 143 may include at least one selected from the group consisting of Ag, Al, Mg, Li, Ca, Cu, LiF/Ca, LiF/Al, MgAg, and CaAg. However, structures and materials of the opposite electrode 143 are not limited thereto and may be modified in various ways.

The encapsulation structure 150 is disposed on the opposite electrode 143, and the encapsulation structure 150 may prevent or reduce penetration of external water or oxygen through the display area DA. The encapsulation structure 150 may cover the display area DA and extend to the peripheral area PA.

According to an exemplary embodiment, the encapsulation structure 150 may include a first inorganic layer 151, an organic layer 152, and a second inorganic layer 153 sequentially disposed over the opposite electrode 143. The first inorganic layer 151 may include silicon oxide, silicon nitride, and/or silicon oxynitride. The first inorganic layer 151 is formed along a structure therebelow, and thus, an upper surface of the first inorganic layer 151 may not be flat as illustrated in FIG. 2. The organic layer 152 may cover the first inorganic layer 151 and planarize the upper surface of the first inorganic layer 151. The organic layer 152 may include at least one material selected from the group consisting of PET, PEN, PC, PI, polyethylenesulfonate, polyoxymethylene, polyarylate, and hexamethyldisiloxane. The second inorganic layer 153 may cover the organic layer 152 and include silicon oxide, silicon nitride, and/or silicon oxynitride.

As shown above, the encapsulation structure 150 may include the first inorganic layer 151, the organic layer 152, and the second inorganic layer 153, and thus, even if cracks occur in the encapsulation structure 150, the encapsulation structure 150 having the multi-layered structure may prevent cracks from occurring between the first inorganic layer 151 and the organic layer 152 or between the organic layer 152 and the second inorganic layer 153.

The first conductive layer 136 including the at least one opening 136H is disposed in the peripheral area PA of the substrate 110. The first conductive layer 136 may be electrically connected to the opposite electrode 143, and may function as a first power wire ELVSS supplying power to the opposite electrode 143.

According to an exemplary embodiment, a connection wire 160 connecting the opposite electrode 143 with the first conductive layer 136 may be disposed in the peripheral area PA of the substrate 110. The connection wire 160 may be disposed on a same layer as the pixel electrode 141 and may include a same material as the pixel electrode 141. The connection wire 160 may be disposed below the opposite electrode 143 extending from the display area DA to the peripheral area PA so as to contact the opposite electrode 143, and may extend from the area at which the connection wire 160 contacts the opposite electrode 143 to above the first conductive layer 136 so as to contact the first conductive layer 136.

According to an exemplary embodiment, the connection wire 160 may cover the opening 136H included in the first conductive layer 136.

The first conductive layer 136 may be disposed on a same layer as the source electrode 126S and the drain electrode 126D of the thin film transistor TFT1 and may include a same material as the source electrode 126S and the drain electrode 126D.

According to an exemplary embodiment, the first conductive layer 136 may include Ti. For example, the first conductive layer 136 may be a triple layer of Ti/Al/Ti.

A first block structure 170 and a second block structure 180 may be disposed on the first conductive layer 136 so as to be separated from each other with the opening 136H therebetween. The first block structure 170 may be disposed so as to be separated from the first conductive layer 136 with the connection wire 160 between the first block structure 170 and the first conductive layer 136.

According to an exemplary embodiment, the second block structure 180 may be disposed at an outer side of the first block structure 170 so as to surround at least a portion of the first block structure 170, and a height $h_2$ of the second block structure 180 may be greater than a height $h_1$ of the first block structure 170. Here, an "outer side" denotes a portion farther from the display area DA.

According to an exemplary embodiment, a second conductive layer 134 may be disposed between the substrate 110 and the first conductive layer 136 so as to be insulated from the first conductive layer 136. Also, the opening 136H included in the first conductive layer 136 may overlap with at least a portion of the second conductive layer 134 in plan view. The second conductive layer 134 may be disposed on a same layer as the gate electrode 124 and may include a same material as the gate electrode 124. For example, the second conductive layer 134 may include Mo having high surface flatness. The second insulating layer 115 may be disposed between the first conductive layer 136 and the second conductive layer 134 and extend from the display area DA to the peripheral area PA.

According to an exemplary embodiment, the first block structure 170 may include first layers 171 and 172 disposed on a same layer as the pixel-defining layer 118 and including a same material as the pixel-defining layer 118, and the first layers 171 and 172 may together form a double layer like the pixel-defining layer 118. The second block structure 180 may include a first layer 181 disposed on a same layer as the via-insulating layer 117 and including a same material as the via-insulating layer 117, and second layers 182 and 183 disposed on the same layer as the pixel-defining layer 118 and including the same material as the pixel-defining layer 118. The second layers 182 and 183 may together form a double layer like the pixel-defining layer 118. FIG. 2 illustrates the pixel-defining layer 118, the first layers 171 and 172 of the first block structure 170, and the second layers 182 and 183 of the second block structure 180 as double layers. However, the present inventive concept is not limited thereto, and the pixel-defining layer 118, the first layers 171 and 172, and the second layers 182 and 183 may be formed as single layers.

The encapsulation structure 150 may be disposed on the first block structure 170 and the second block structure 180 and extend from the display area DA to the peripheral area PA. The first inorganic layer 151 and the second inorganic layer 153 included in the encapsulation structure 150 may cover the first block structure 170 and the second block structure 180 and contact each other on the first block structure 170 and the second block structure 180. That is, the organic layer 152 disposed between the first inorganic layer 151 and the second inorganic layer 153 may be disposed only at an inner side of the first block structure 170, and thus, the first inorganic layer 151 and the second inorganic layer 153 may directly contact each other at an outer side of the first block structure 170 at which the organic layer 152 is not disposed. The encapsulation structure 150 may encapsulate the organic light-emitting device OLED so that impurities, such as oxygen and water, do not penetrate through the organic light-emitting device OLED disposed on the display area DA. However, when the organic layer 152 extends to an outermost area of the organic light-emitting display apparatus, impurities, such as oxygen and water from the outside, may penetrate through the organic light-emitting display apparatus though the organic layer 152, and thus, may be transported through the organic light-emitting device OLED. That is, the organic layer 152 may function as a passage for penetration of impurities. However, the organic light-emitting display apparatus according to an exemplary embodiment may include the first block structure 170, and thus, the organic layer 152 may not extend to the outer side of the first block structure 170 due to being blocked by the first block structure 170. That is, the organic layer 152 may be disposed only at the inner side of the first block structure 170.

Referring to FIG. 2, a third conductive layer 127, a fourth conductive layer 128, and a thin film transistor TFT2 may further be disposed in the peripheral area PA of the substrate 110, wherein the third conductive layer 127, the fourth conductive layer 128, and the thin film transistor TFT2 are disposed on the same layer as the source electrode 126S and the drain electrode 126D and include the same material as the source electrode 126S and the drain electrode 126D. The thin film transistor TFT2 may be a portion of a circuit unit for controlling an electrical signal applied to the display area DA, and the third conductive layer 127 and the fourth conductive layer 128 may be portions of a second power wire ELVDD and a data wire, respectively.

Figure 3:
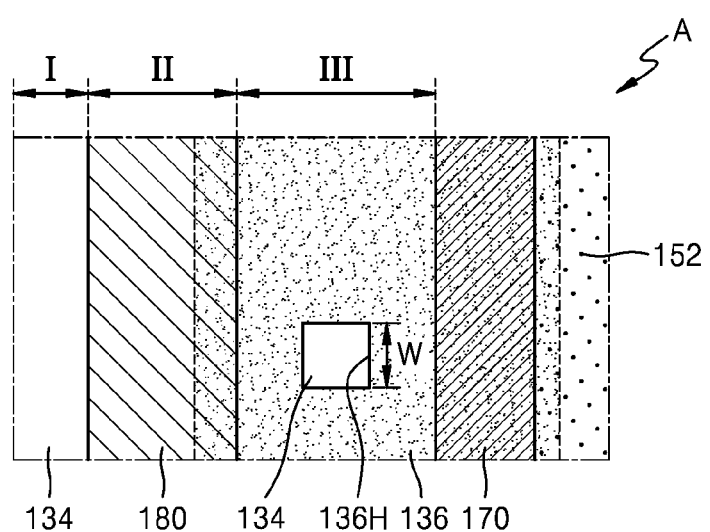
FIG. 3 is an enlarged plan view of an area A of FIG. 1.

FIG. 3 is an enlarged schematic plan view of an area A of FIG. 1.

Referring to FIG. 3, the second conductive layer 134 is disposed at an area I, which is at an outer side of the second block structure 180, the second block structure 180 is disposed at an area II, and the first conductive layer 136 including the opening 136H is disposed at an area III between the first block structure 170 and the second block structure 180. The organic layer 152 included in the encapsulation structure 150 is disposed at the right side of the area III, with reference of FIG. 3.

FIG. 3 illustrates the opening 136H having a rectangular shape. However, the shape of the opening 136H is not limited thereto, and the opening 136H may have various shapes, such as a rectangular shape, a polygonal shape, a circular shape, an oval shape, etc., which have rounded apexes.

According to an exemplary embodiment, a width of the opening 136H may be equal to or greater than about 2 µm. Here, the width may be defined as a minimum value from a length of each side of the opening 136H when the opening 136H has a polygonal shape, and as a diameter of a circumcircle of the opening 136H when the opening 136H has a shape of a curved line. The numerical value is based on a design rule. That is, it is not easy to pattern the opening 136H to have a width less than about 2 µm, due to limitation of a process capability or equipment availability.

According to an exemplary embodiment, a surface roughness of the first conductive layer 136 may be greater than a surface roughness of the second conductive layer 134. Here, the surface roughness refers to a size of minute concave-convex shapes generated on a surface of a material. When the surface is cut into a flat surface perpendicular to a measurement object, an upper surface of the measurement object forms a certain curved line when seen from a cross-sectional perspective, and a height difference between a lowest point and a highest point of the curved line may be defined as the surface roughness. In addition to this, there are various ways to define the surface roughness.

According to an exemplary embodiment, the first conductive layer 136 may include Ti and the second conductive layer 134 may include Mo. A surface roughness of Ti may be greater than a surface roughness of Mo, and since the second conductive layer 134 having high surface flatness rather than the first conductive layer 136 having high surface roughness is disposed so as to overlap the opening 136H included in the first conductive layer 136, a surface of an area corresponding to the opening 136H may have high surface flatness. The area corresponding to the opening 136H may be a point at which it is measured whether the organic layer 152 is disposed between the first block structure 170 and the second block structure 180. This aspect will be described later.

FIGS. 4A through 4G are cross-sectional views for sequentially describing a method of manufacturing the organic light-emitting display apparatus of FIG. 2. Hereinafter, the method of manufacturing the organic light-emitting display apparatus, according to an exemplary embodiment, will be sequentially described, with reference to FIGS. 4A through 4G.

Figure 4A:
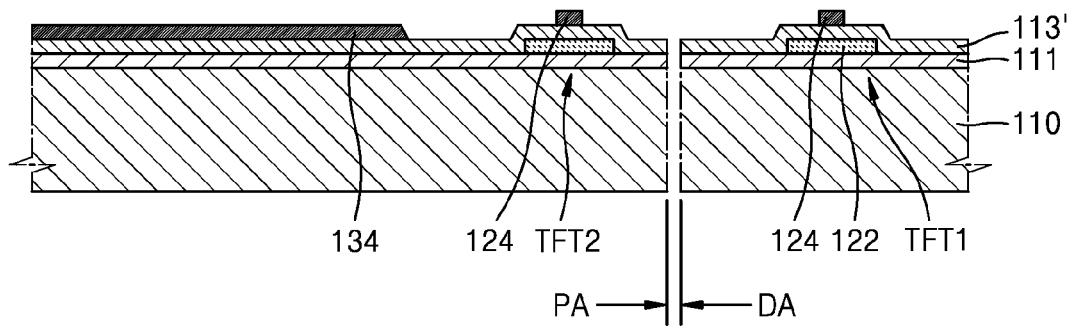
FIG. 4A, FIG. 4B, FIG. 4C, FIG. 4D, FIG. 4E, FIG. 4F, and FIG. 4G are cross-sectional views for sequentially describing a method of manufacturing the organic light-emitting display apparatus of FIG. 2.

FIG. 4A is a cross-sectional view for describing forming the active layer 122, a first insulating material 113', and the gate electrode 124 over the substrate 110.

The substrate 110 includes the display area DA and the peripheral area PA at the outer side of the display area DA. The substrate 110 may include various materials, as described above. The buffer layer 111 including an inorganic material, such as silicon oxide, silicon nitride, and/or silicon oxynitride, may be formed on the substrate 110. The function of the buffer layer 111 is as described above.

The active layer 122 is formed in the display area DA of the substrate 110 by a mask process. The active layer 122 may include a semiconductor material, such as amorphous silicon, polycrystalline silicon, an oxide semiconductor, or an organic semiconductor material.

Thereafter, the first insulating material 113' is formed over the substrate 110. The first insulating material 113' may include an inorganic material, such as silicon oxide, silicon nitride, and/or silicon oxynitride. Thereafter, the gate electrode 124 is formed on the first insulating material 113' by a mask process. The gate electrode 124 is insulated from the active layer 122 via the first insulating material 113'.

According to an exemplary embodiment, when the gate electrode 124 is formed, the second conductive layer 134 may be simultaneously formed in the peripheral area PA of the substrate 110. The gate electrode 124 and the second conductive layer 134 may be formed as a single layer or multiple layers including at least one of Al, Pt, Pd, Ag, Mg, Au, Ni, Nd, Ir, Cr, Li, Ca, Mo, Ti, W, and Cu.

According to an exemplary embodiment, the gate electrode 124 and the second conductive layer 134 may include Mo having high surface flatness.

Figure 4B:
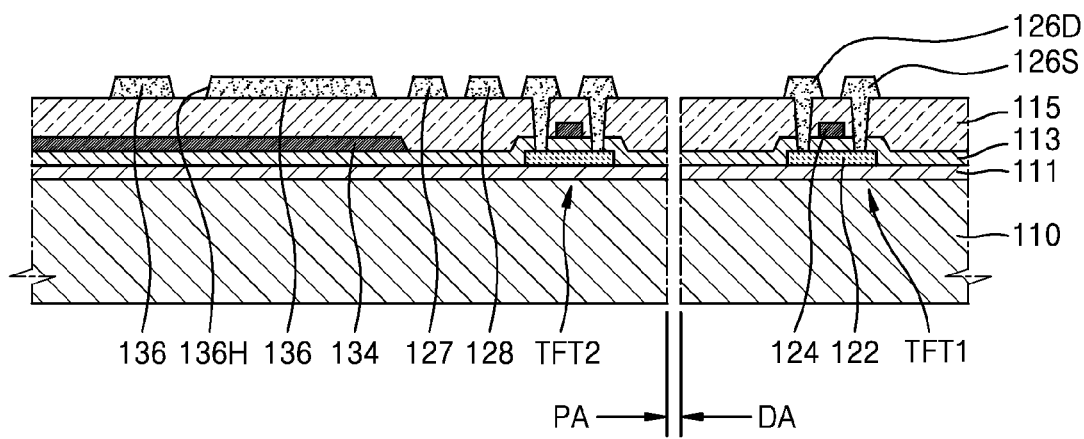

Referring to FIG. 4B, after a second insulating material (not shown) including an inorganic material, such as silicon oxide, silicon nitride, and/or silicon oxynitride, is formed on the gate electrode 124, an opening exposing a portion of the active layer 122 is formed in the first insulating material 113' and the second insulating material to form the first insulating layer 113 and the second insulating layer 115.

After the second insulating layer 115 is formed, the source electrode 126S, the drain electrode 126D, and the first conductive layer 136 including the at least one opening 136H are formed on the second insulating layer 115. The first conductive layer 136 may be formed in the peripheral area PA of the substrate 110 simultaneously with the source electrode 126S and the drain electrode 126D of the thin film transistor TFT1. The source electrode 126S, the drain electrode 126D, and the first conductive layer 136 may be formed as a single layer or multiple layers including at least one of, for example, Al, Pt, Pd, Ag, Mg, Au, Ni, Nd, Ir, Cr, Li, Ca, Mo, Ti, W, and Cu, by taking into account conductivity, etc.

According to an exemplary embodiment, the source electrode 126S, the drain electrode 126D, and the first conductive layer 136 may include Ti, and may be triple layers including Ti/Al/Ti. Here, Ti disposed on the uppermost layer does not have high surface flatness, and thus, upper surfaces of the source electrode 126S, the drain electrode 126D, and the first conductive layer 136 may include minute concave-convex shapes.

Additionally, the third conductive layer 127 and/or the fourth conductive layer 128 may be simultaneously formed on the same layer as the source electrode 126S and the drain electrode 126D. The third conductive layer 127 and/or the fourth conductive layer 128 may be formed in the peripheral area PA and may include the same material as the source electrode 126S, the drain electrode 126D, and the first conductive layer 136. The third conductive layer 127 and the fourth conductive layer 128 may be portions of the second power wire ELVSS and the data wire, respectively.

Each of the source electrode 126S and the drain electrode 126D is electrically connected to the active layer 122. As such, the thin film transistor TFT1 is formed including the active layer 122, the gate electrode 124 insulated from the active layer 122, and the source electrode 126S and the drain electrode 126D, the source electrode 126S and the drain electrode 126D each being connected to the active layer 122.

Figure 4C:
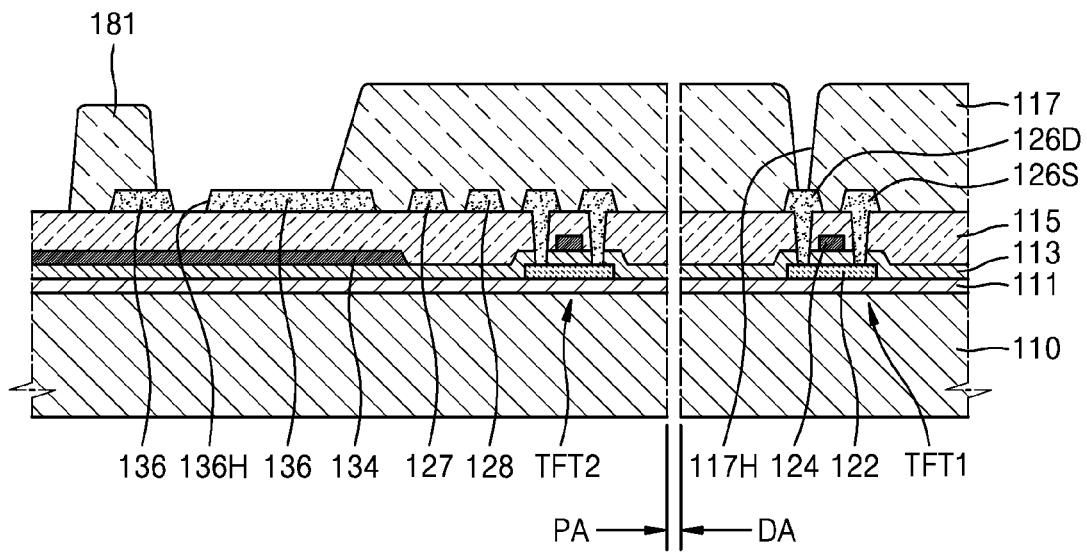

Referring to FIG. 4C, the via-insulating layer 117 covering the thin film transistor TFT1 is formed over the substrate 110. The via-insulating layer 117 includes the via-hole 117H exposing the source electrode 126S or the drain electrode 126D of the thin film transistor TFT1. The via-insulating layer 117 may cover a portion of the first conductive layer 136.

According to an exemplary embodiment, when the via-insulating layer 117 is formed, the first layer 181 of the second block structure 180 may be simultaneously formed. The second block structure 180 may overlap at least a portion of the first conductive layer 136 in plan view. However, the second block structure 180 does not overlap the opening 136H of the first conductive layer 136. Also, the second block structure 180 and the second conductive layer 134 may overlap each other in plan view.

Figure 4D:
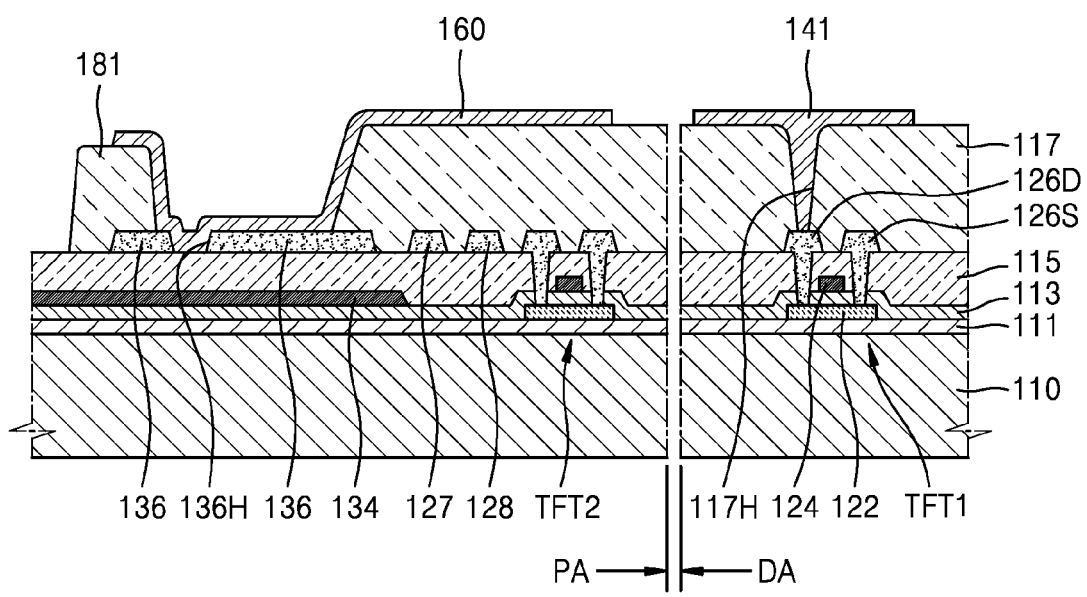

Referring to FIG. 4D, the pixel electrode 141 is formed to be electrically connected to the thin film transistor via the via-hole 117H. The pixel electrode 141 is formed in the display area DA of the substrate 110.

According to an exemplary embodiment, the connection wire 160 connecting the opposite electrode 143 and the first conductive layer 136 may be formed in the peripheral area PA of the substrate 110. The connection wire 160 may be formed simultaneously with the pixel electrode 141. The connection wire 160 may extend from an area contacting the opposite electrode 143 to an area between the first conductive layer 136 and the first block structure 170 (FIG. 4E) and cover the opening 136H included in the first conductive layer 136.

Figure 4E:
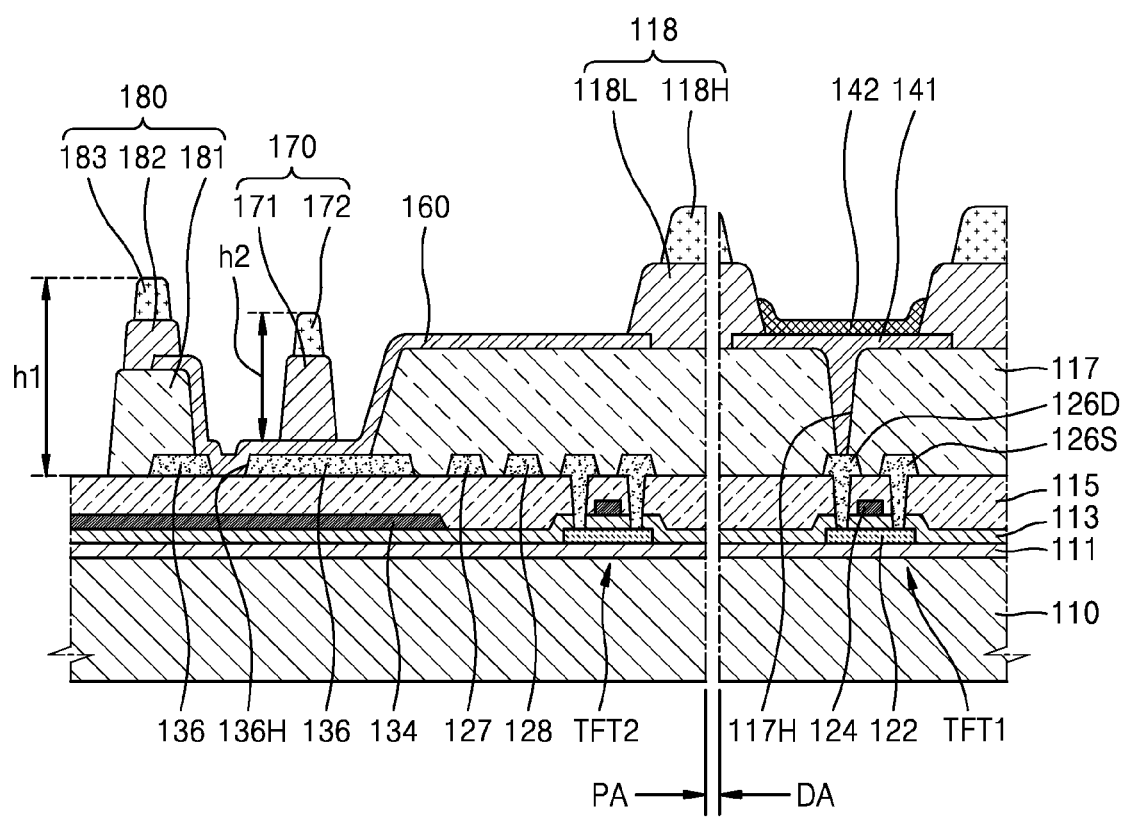

Referring to FIG. 4E, the pixel-defining layer 118 including an opening exposing at least a portion of the pixel electrode 141 is formed on the pixel electrode 141. The pixel-defining layer 118 may include an organic material, such as PI or HMDSO. The pixel-defining layer 118 may be formed as a single layer or multiple layers. In FIG. 4E, it is illustrated that the pixel-defining layer 118 is a double layer 118L and 118H. However, the present inventive concept is not limited thereto, and the pixel-defining layer 118 may be formed as a single layer, or multiple layers including three or more layers.

According to an exemplary embodiment, when the pixel-defining layer 118 is formed, the first layers 171 and 172 of the first block structure 170, and the second layers 182 and 183 of the second block structure 180 may be formed at the same time. Here, the second block structure 180 includes the first layer 181 and the second layers 182 and 183 disposed on the first layer 181, and the first block structure 170 includes the first layers 171 and 172 disposed on the same layer as the second layers 182 and 183 of the second block structure 180. FIG. 4E illustrates the first layers 171 and 172 of the first block structure 170, and the second layers 182 and 183 of the second block structure 180, as double layers like the pixel-defining layer 118. However, the present inventive concept is not limited thereto.

The first block structure 170 and the second block structure 180 may be formed on the first conductive layer 136 and separated from each other with the opening 136H therebetween, so that the first block structure 170 and the second block structure 180 do not overlap the opening 136H. According to an exemplary embodiment, the second block structure 180 may be formed at the outer side of the first block structure 170 to surround at least a portion of the first block structure 170, and a height $h_2$ of the second block structure 180 may be greater than a height $h_1$ of the first block structure 170. Here, the "outer side" denotes a portion which is farther from the display area DA of the substrate 110.

Thereafter, the intermediate layer 142 is formed on the pixel electrode 141 exposed by the pixel-defining layer 118. The intermediate layer 142 may further include at least one of an HIL, an HTL, an ETL, and an EIL, in addition to the organic emission layer.

Figure 4F:
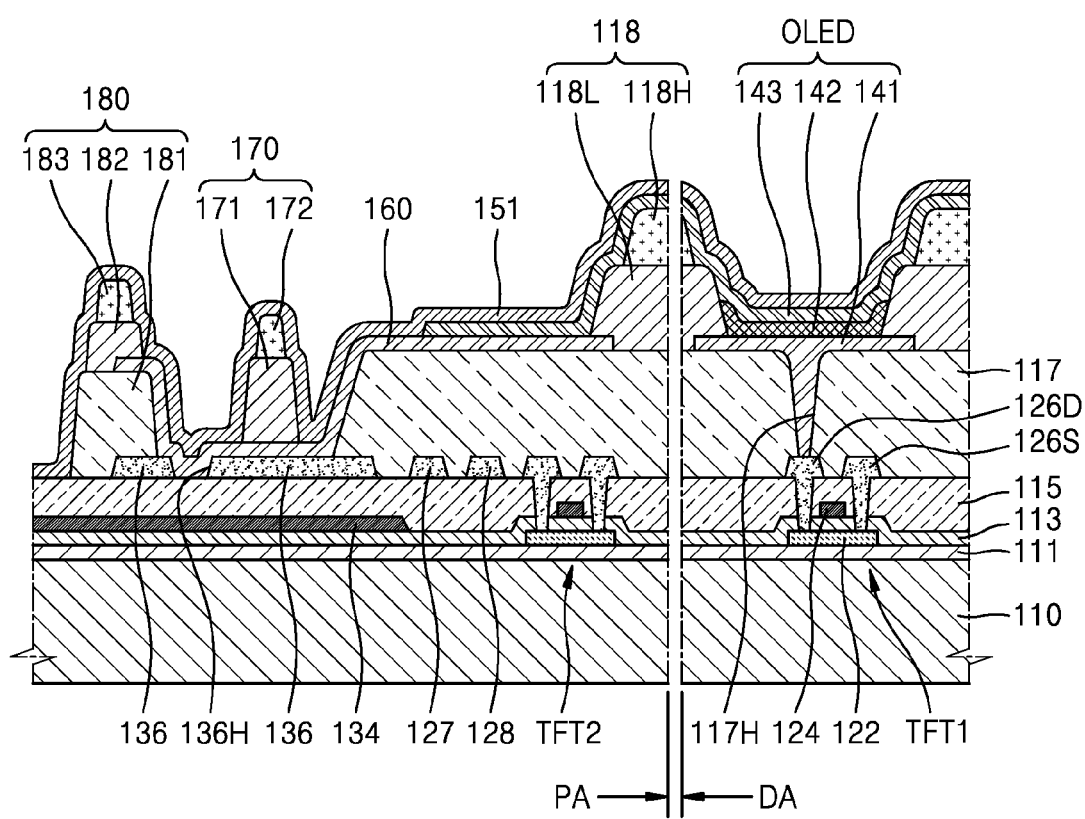

Referring to FIG. 4F, the opposite electrode 143 is formed on the intermediate layer 142.

The opposite electrode 143 may be formed in the display area DA and the peripheral area PA and may be formed on the intermediate layer 142 and the pixel-defining layer 118. The opposite electrode 143 may be integrally formed in a plurality of pixels unlike the pixel electrode 141. The opposite electrode 143 may be formed to cover a portion of the connection wire 160 formed in the peripheral area PA, and may be electrically connected to the connection wire 160. The opposite electrode 143 may not extend to an area in which the first conductive layer 136 is formed, and the connection wire 160 may function as a bridge wire for electrically connecting the opposite electrode 143 and the first conductive layer 136 which are apart from each other.

After the opposite electrode 143 is formed, the first inorganic layer 151 of the encapsulation structure 150 is formed on the opposite electrode 143 and throughout the display area DA and the peripheral area PA. The first inorganic layer 151 may be formed to cover the opposite electrode 143, the first block structure 170, and the second block structure 180.

Figure 4G:
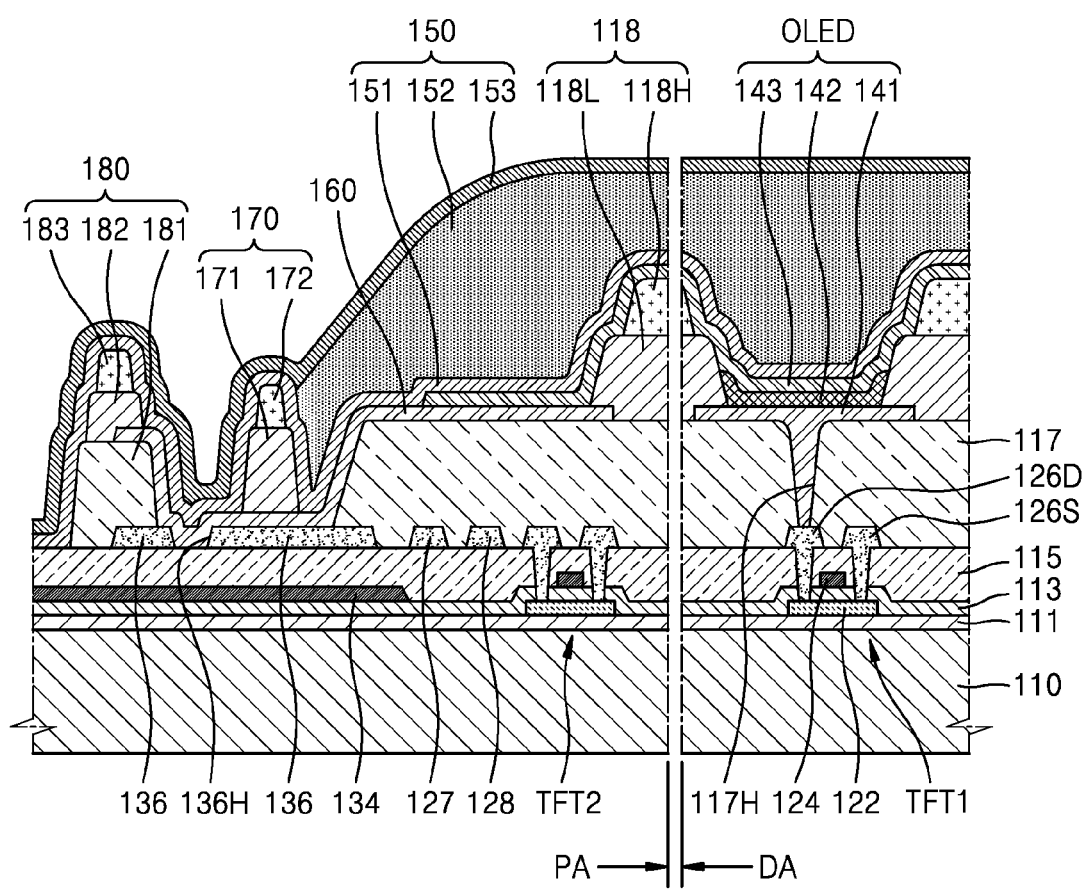

Referring to FIG. 4G, the organic layer 152 is formed on the first inorganic layer 151 disposed at an inner side of the first block structure 170, and the second inorganic layer 153 is formed on the organic layer 152 and the first inorganic layer 151 covering the first block structure 170 and the second block structure 180. Here, the first inorganic layer 151 and the second inorganic layer 153 may contact each other over the first block structure 170 and the second block structure 180. That is, the organic layer 152 disposed between the first inorganic layer 151 and the second inorganic layer 153 is disposed only at the inner side of the first block structure 170, and the first inorganic layer 151 and the second inorganic layer 153 may directly contact each other at the outer side of the first block structure 170 where the organic layer 152 is not disposed. The encapsulation structure 150 including the first inorganic layer 151, the organic layer 152, and the second inorganic layer 153 may encapsulate the organic light-emitting device OLED so that impurities, such as oxygen and water, may not penetrate through the organic light-emitting device OLED disposed in the display area DA. However, when the organic layer 152 extends to the outermost area of the organic light-emitting display apparatus, impurities, such as external oxygen and water, may penetrate through the organic light-emitting display apparatus via the organic layer 152 and be transported to the organic light-emitting device OLED. That is, the organic layer 152 may function as a passage through which impurities may penetrate through the organic light-emitting device OLED. However, the organic light-emitting display apparatus according to the exemplary embodiments may include the first block structure 170 so that the organic layer 152 may not extend to the outer side of the first block structure 170 due to being blocked by the first block structure 170. That is, the organic layer 152 may be disposed only at the inner side of the first block structure 170.

Figure 5A:
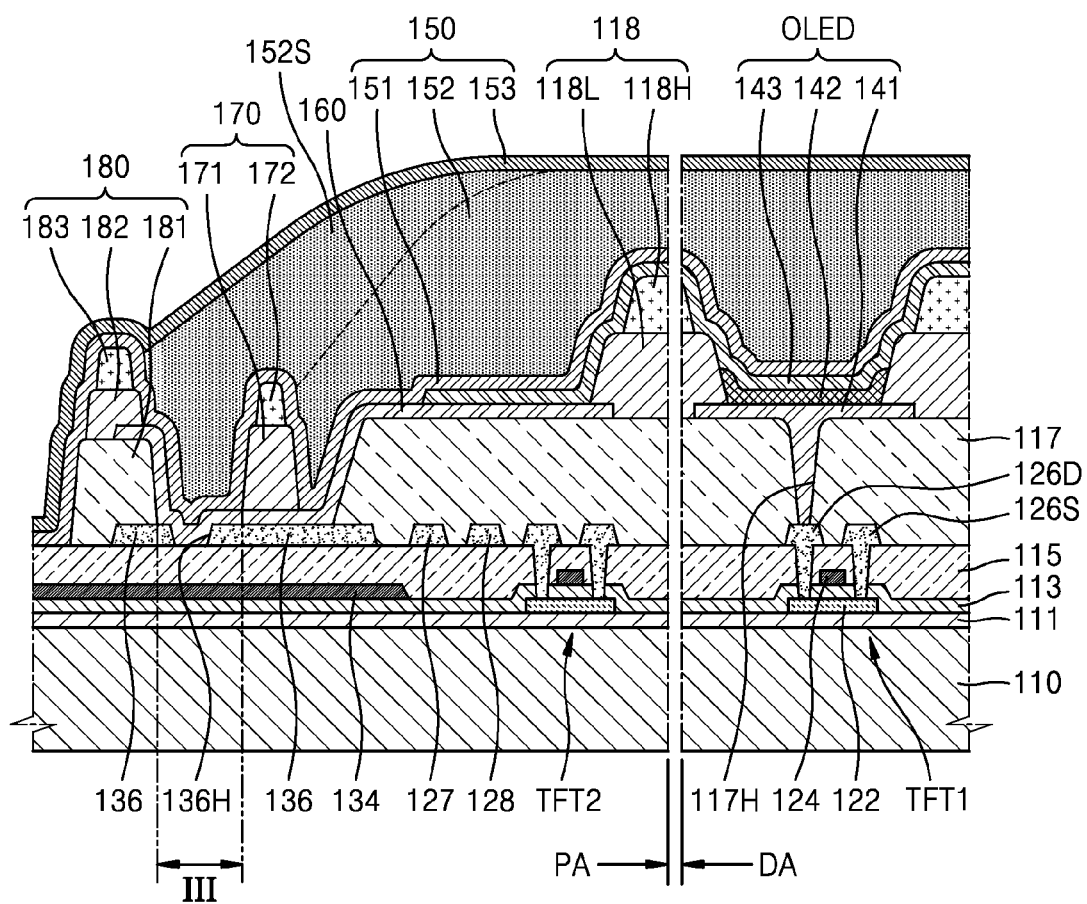
FIG. 5A and FIG. 5B are a schematic cross-sectional view and a schematic plan view, respectively, illustrating a portion of an organic light-emitting display apparatus according to a comparative embodiment.
Figure 5B:
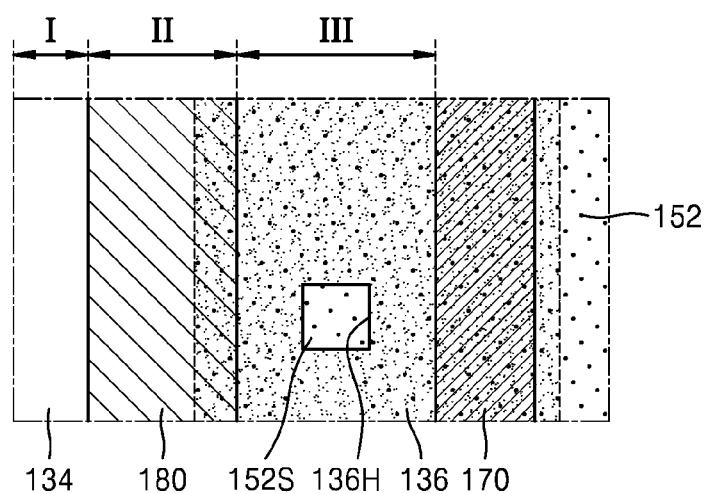

FIGS. 5A and 5B are respectively a schematic cross-sectional view and a schematic plan view of a portion of an organic light-emitting display apparatus, according to a comparative embodiment.

FIGS. 5A and 5B are respectively the cross-sectional view and the plan view of the organic light-emitting display apparatus showing the organic layer 152 having leaked out to form leakage 152S in an area between the first block structure 170 and the second block structure 180.

The organic layer 152 may unintentionally leak out to the outer side of the first block structure 170 due to abnormalities in equipment or a process. FIG. 5A illustrates the case in which the organic layer 152 has leaked out to form leakage 152S in an area III between the first block structure 170 and the second block structure 180.

Here, referring to FIGS. 3 and 5B, a concave-convex shape of each surface in areas I through III may be observed by using a DIC microscope, etc. The first conductive layer 136 having high surface roughness is disposed below the area III between the first block structure 170 and the second block structure 180, and thus, when the remaining area of the first conductive layer 136 except the opening 136H is measured by using the microscope, a concave-convex shape of a surface of the first conductive layer 136 is observed. Also, when the area in which the organic layer 152 is disposed is measured by using the microscope, a concave-convex shape of a surface of the organic layer 152 having high surface roughness is observed.

Referring to FIG. 5B, the organic layer 152 has leaked out to form leakage 152S in the area III between the first block structure 170 and the second block structure 180. Here, before the organic layer 152 has leaked out, since the first conductive layer 136 having high surface roughness is disposed below the area III, it is hard to distinguish whether the concave-convex shape of the surface of the area III is due to the first conductive layer 136 or the organic layer 152. However, since the first conductive layer 136 includes the opening 136H, the concave-convex shape of the organic layer 152 is observed in the opening 136H when the organic layer 152 has leaked out to form the leakage 152S. On the contrary, referring to FIG. 3, the surface of the second conductive layer 134 is observed via the opening 136H of the first conductive layer 136. Thus, when the organic layer 152 has not leaked out, the concave-convex shape is not observed in the opening 136H. Thus, whether the organic layer 152 has leaked out to the area III may be inspected by observing the opening 136H by using a DIC microscope.

Figure 6:
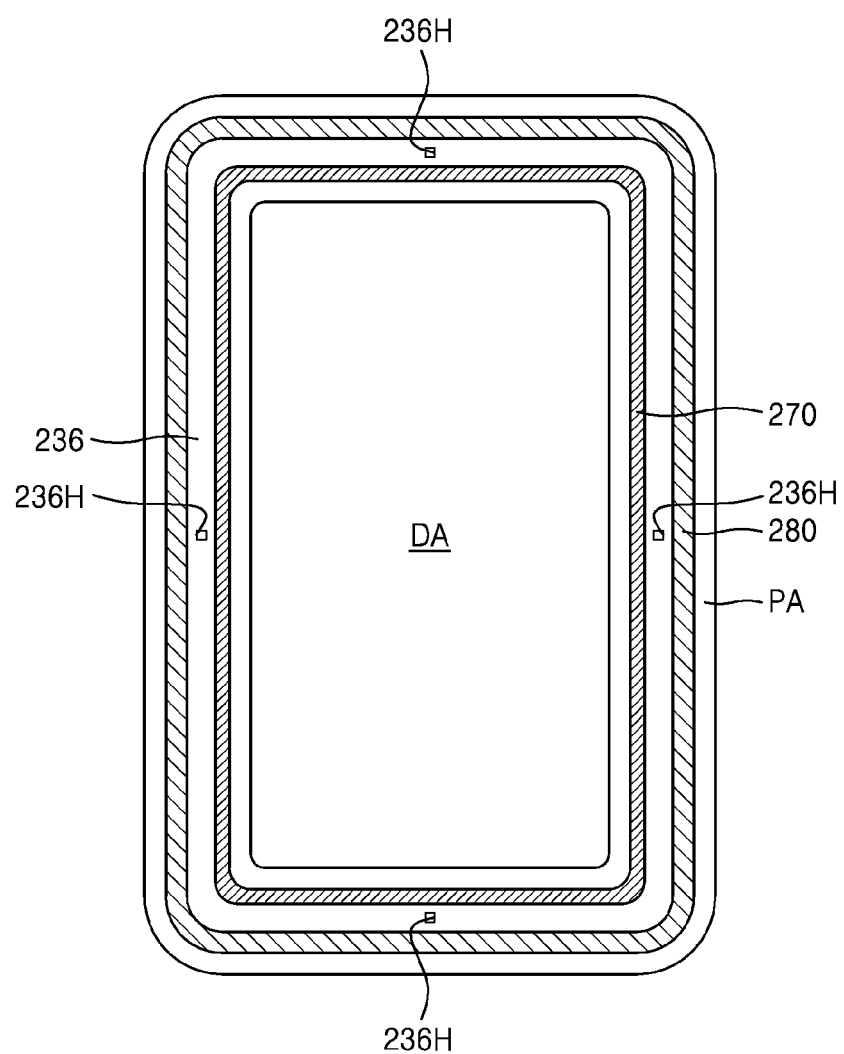
FIG. 6 is a schematic plan view of an organic light-emitting display apparatus according to another exemplary embodiment.

FIG. 6 is a schematic plan view of an organic light-emitting display apparatus according to another exemplary embodiment.

A first block structure 270 and a second block structure 280 are disposed in the peripheral area PA at an outer side of the display area DA. A first conductive layer 236 is disposed below an area between the first block structure 270 and the second block structure 280.

According to an exemplary embodiment, the first conductive layer 236 has a plurality of openings 236H. Referring to FIG. 6, at least one opening 236H may be formed at each of upper, lower, right, and left sides of the display area DA. To which side of the display area DA an organic layer (not shown) has leaked out may be inspected via the opening 236H. FIG. 6 illustrates that one opening 236H is formed at each of the upper, lower, right, and left sides of the display area DA. However, this is provided only as an example.

According to the organic light-emitting display apparatus and the method of manufacturing the same according to an exemplary embodiment, the first conductive layer 136 disposed below the first block structure 170 and the second block structure 180 includes the opening 136H corresponding to an area between the first block structure 170 and the second block structure 180, and whether an organic layer is disposed between the first block structure 170 and the second block structure 180 may be precisely detected by using the opening 136H as a measuring point, and thus, a defect rate of the organic light-emitting display apparatus may be reduced.

As described above, according to the one or more of the above exemplary embodiments, the organic light-emitting display apparatus having a decreased defect rate due to precise detection of whether or not an organic layer is disposed between the block structures, and the method of manufacturing the organic light-emitting display apparatus may be provided.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display apparatus, comprising:
    a substrate comprising a display area and a peripheral area at an outer side of the display area;
    a pixel electrode disposed in the display area of the substrate;
    an intermediate layer disposed on the pixel electrode;
    an opposite electrode disposed on the intermediate layer;
    a first conductive layer disposed in the peripheral area of the substrate;
    a first block structure and a second block structure disposed on the first conductive layer and separated from each other; and
    a connection wire disposed in the peripheral area of the substrate, connecting the opposite electrode to the first conductive layer, and including a same material as the pixel electrode,
    wherein:
    the connection wire is disposed in a region between the first block structure and the second block structure;
    the first conductive layer has at least one opening located between the first blocking structure and the second blocking structure; and
    a width of the at least one opening is equal to or less than a width of the region between the first block structure and the second block structure.

2. The organic light-emitting display apparatus of claim 1, wherein the second block structure at least partially overlaps with the connection wire.

3. The organic light-emitting display apparatus of claim 1, further comprising an encapsulation structure disposed on the opposite electrode in the display area and the peripheral area,
    wherein:
    the encapsulation structure comprises a first inorganic layer, an organic layer, and a second inorganic layer that are sequentially disposed over the opposite electrode; and
    the first block structure at least partially overlaps the organic layer.

4. The organic light-emitting display apparatus of claim 3, wherein the first block structure fully overlaps the first inorganic layer.

5. The organic light-emitting display apparatus of claim 3, wherein the second block structure fully overlaps the first inorganic layer.

6. The organic light-emitting display apparatus of claim 1, wherein the first conductive layer has at least one opening.

7. The organic light-emitting display apparatus of claim 6, further comprising a second conductive layer disposed between the substrate and the first conductive layer and insulated from the first conductive layer.

8. The organic light-emitting display apparatus of claim 6, wherein the connection wire covers the at least one opening in the first conductive layer.

9. The organic light-emitting display apparatus of claim 6, wherein the width of the at least one opening in the first conductive layer is greater than or equal to about 2 µm.

10. The organic light-emitting display apparatus of claim 1, wherein the first block structure fully overlaps with the connection wire.

11. The organic light-emitting display apparatus of claim 10, wherein the at least one opening in the first conductive layer overlaps at least a portion of the second conductive layer in a plan view.

12. The organic light-emitting display apparatus of claim 10, further comprising:
    a thin film transistor disposed in the display area of the substrate and electrically connected to the pixel electrode; and
    a via-insulating layer covering the thin film transistor, wherein:
    the thin film transistor comprises an active layer, a gate electrode insulated from the active layer and including a same material as the second conductive layer, a source electrode, and a drain electrode; and
    each of the source electrode and the drain electrode includes a same material as the first conductive layer.

13. The organic light-emitting display apparatus of claim 1, wherein the first inorganic layer and the second inorganic layer cover the first block structure and the second block structure and contact each other over the first block structure and the second block structure.

14. The organic light-emitting display apparatus of claim 1, wherein the second block structure at least partially overlaps the first conductive layer.

15. An organic light-emitting display apparatus, comprising:
    a substrate comprising a display area and a peripheral area at an outer side of the display area;
    a pixel electrode disposed in the display area of the substrate;
    an intermediate layer disposed on the pixel electrode;
    an opposite electrode disposed on the intermediate layer;
    a first conductive layer disposed in the peripheral area of the substrate;
    a first block structure and a second block structure disposed on the first conductive layer and separated from each other;
    a connection wire disposed in the peripheral area of the substrate, connecting the opposite electrode to the first conductive layer, and including a same material as the pixel electrode; and
    an encapsulation structure disposed on the opposite electrode in the display area and the peripheral area,
    wherein:
    the connection wire is disposed in a region between the first block structure and the second block structure;
    the encapsulation structure comprises a first inorganic layer, an organic layer, and a second inorganic layer that are sequentially disposed over the opposite electrode;
    the first block structure at least partially overlaps the organic layer;
    the first block structure fully overlaps the first inorganic layer;

the first conductive layer at least partially overlaps the organic layer, and a width of the at least one opening is equal to or less than a width of the region between the first block structure and the second block structure.

16. An organic light-emitting display apparatus, comprising:
a substrate comprising a display area and a peripheral area at an outer side of the display area:
a pixel electrode disposed in the display area of the substrate;
an intermediate layer disposed on the pixel electrode:
an opposite electrode disposed on the intermediate layer;
a first conductive layer disposed in the peripheral area of the substrate:
a first block structure and a second block structure disposed on the first conductive layer and separated from each; and
a connection wire disposed in the peripheral area of the substrate, connecting the opposite electrode to the first conductive layer, and including a same material as the pixel electrode,
wherein the connection wire is disposed in a region between the first block structure and the second block structure,
wherein the first block structure fully overlaps the first conductive layer, and
wherein a width of the at least one opening is equal to or less than a width of the region between the first block structure and the second block structure.

* * * * *